[19] United States Patent
Giebeler

[11] Patent Number: 4,785,637
[45] Date of Patent: Nov. 22, 1988

[54] THERMOELECTRIC COOLING DESIGN
[75] Inventor: Robert Giebeler, Cupertino, Calif.
[73] Assignee: Beckman Instruments, Inc., Fullerton, Calif.
[21] Appl. No.: 53,190
[22] Filed: May 22, 1987
[51] Int. Cl.[4] .................. B04B 15/02; F25B 21/02
[52] U.S. Cl. .................................. 62/3; 494/13; 494/14; 165/185
[58] Field of Search ............... 62/3; 165/185; 494/13, 494/14

[56] References Cited
U.S. PATENT DOCUMENTS

| 3,234,048 | 2/1966 | Nelson | 62/3 |
| 3,347,453 | 10/1967 | Goergen | 494/13 |
| 3,444,695 | 5/1969 | Waye et al. | |
| 4,512,758 | 4/1985 | Wedemeyer et al. | |

Primary Examiner—Albert W. Davis, Jr.
Attorney, Agent, or Firm—William H. May; Paul R. Harder

[57] ABSTRACT

A thermoelectric cooling design of the type having a nonconducting substrate mounting thermoelectric coolers is improved. Provisions for a flexible can and improved heat dissipation from the thermoelectric coolers are provided. For improved thermal response, the refrigerated vacuum can is provided with thin walls of high purity aluminum with the result that deformation of the wall surface, especially the bottom wall surface can occur both with respect to installation. A plurality of can heat sinks are placed on the walls of the can to form a unitary and locally rigid side wall to the can at the point of attachment. At least one thermoelectric cooler is communicated to the can heat sinks at a first side for receiving heat energy from the can. A second discharge heat sink is communicated to each thermoelectric cooler for dissipating heat energy from both the can and the thermoelectric cooler. Spring biased connections move the respective heat sinks towards one another and clamp the thermoelectric cooler firmly therebetween. The heat sinks dynamically conform to dimensional changes at the cooler interface during installation. The discharge heat sinks are integrally cast with copper plugs placed in an aluminum mold and the aluminum cast about the copper plugs. The copper plug is preferably gold plated to prevent oxidation and form a heat conducting alloy with the aluminum. This enables heat transfer with a low temperature gradient to produce cooling with high efficiency.

3 Claims, 3 Drawing Sheets

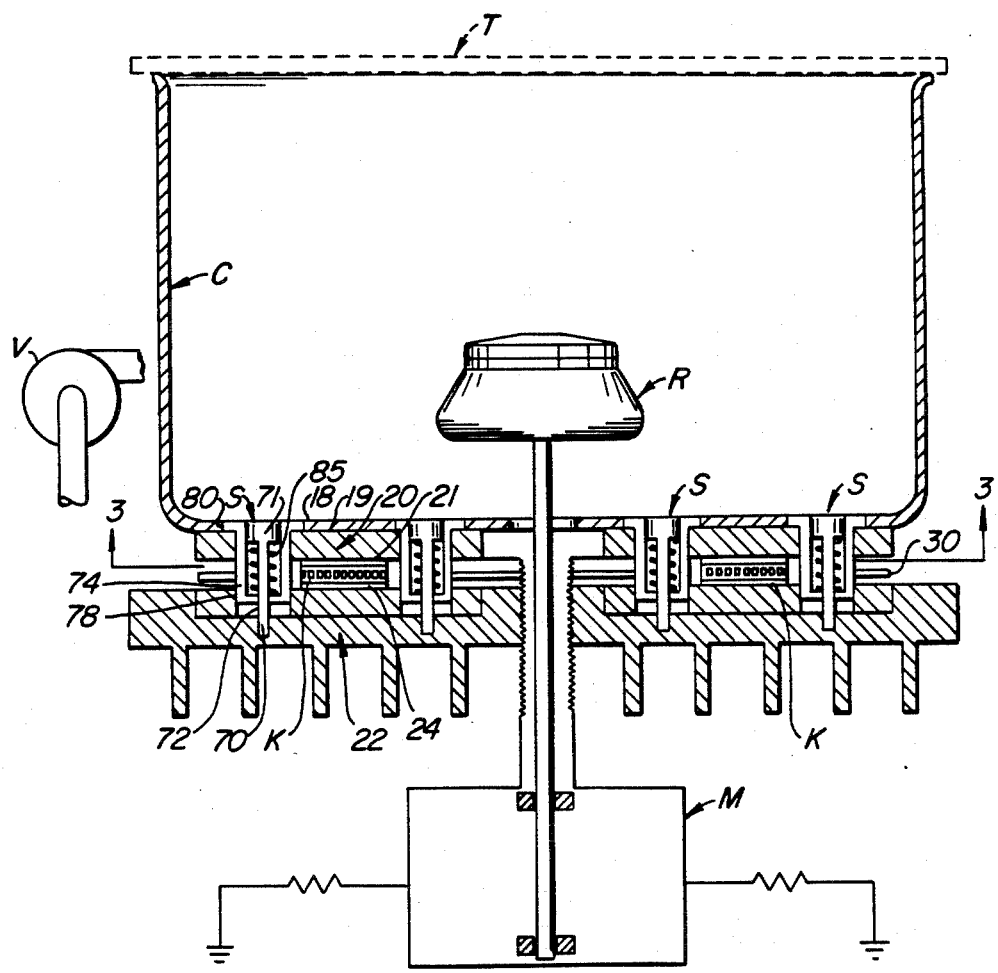
FIG._1A.

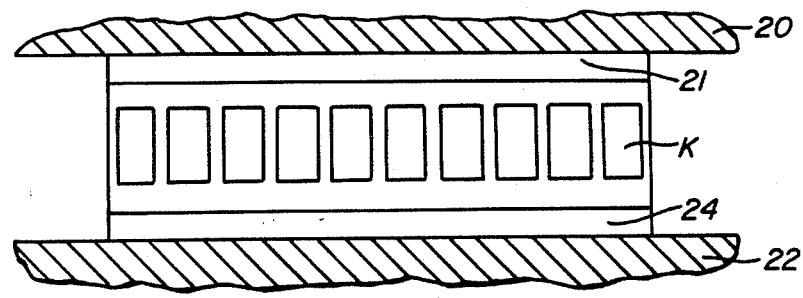
FIG._1B.
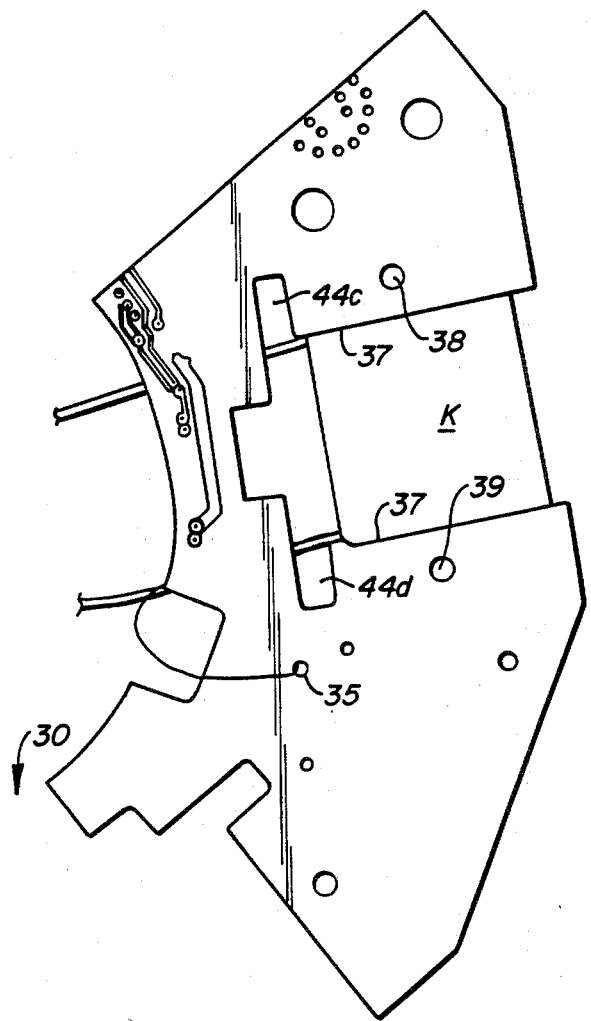
FIG._2.

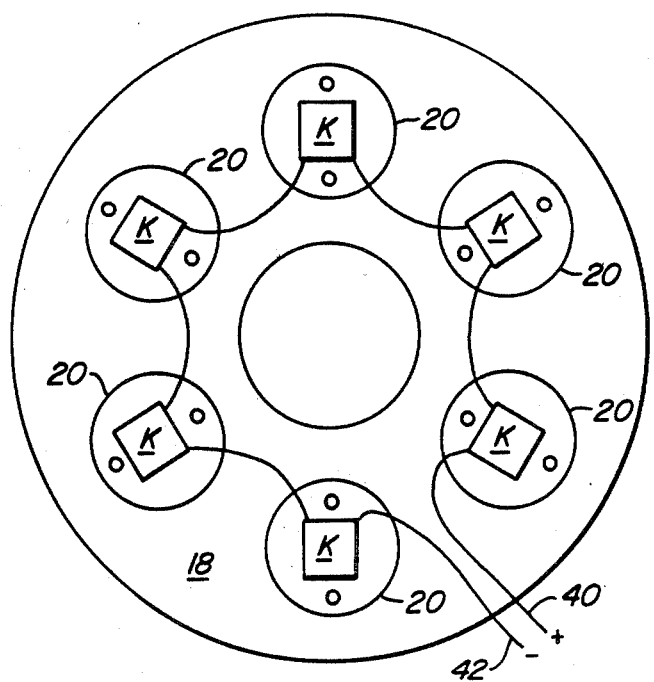
FIG._3.
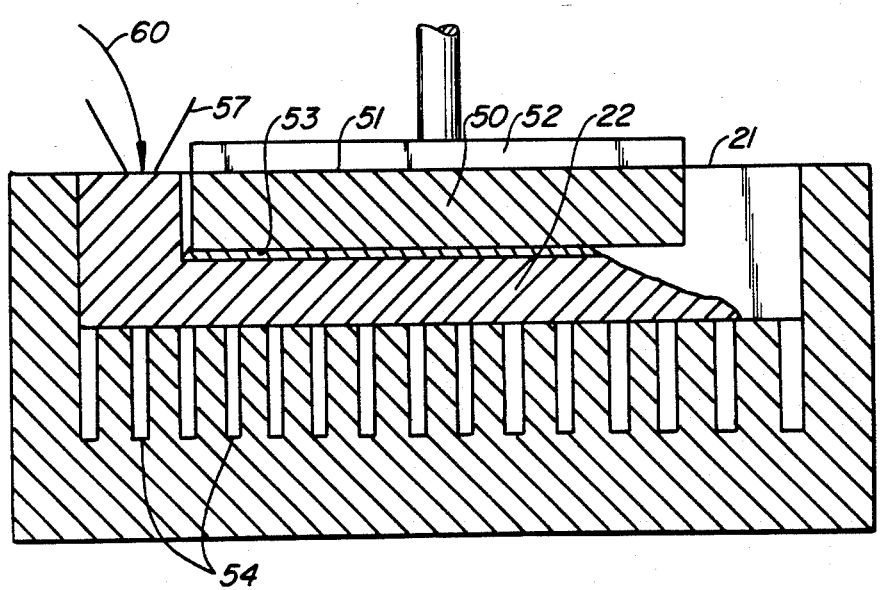
FIG._4.

THERMOELECTRIC COOLING DESIGN

BACKGROUND OF THE INVENTION

This invention relates to thermoelectric coolers preferably designed for installation to centrifuges. More particularly, the cooler is of the type having a nonconducting substrate mounting thermoelectric coolers and is improved with a design provided to cool a flexible can and provide heat sink for the more efficient discharge of energy.

SUMMARY OF THE PRIOR ART

Wedemeyer et al. U.S. Pat. No. 4,512,758 discloses the advantage of a nonconducting substrate grasping a plurality of thermoelectric units. The substrate with attached thermoelectric units is clamped between the bottom of a centrifuging can on one side and a energy dissipating heat sink on the other side. By firmly impressing the can onto the heat sinks, efficient thermal conductivity and hence the removal of heat from the vacuum can readily occurs. The specifics of the construction requires a can in the centrifuge thick enough to enable the can to remain flat and in firm thermal engagement with the heat sinks. Specifically, the can at the upper edges is urged downwardly. The bottom and circular wall of the can is impressed upon the thermoelectric coolers. The flatness combined with the resistance of the can bottom to bending sinks ensures efficient heat transfer to the attached thermoelectric coolers.

Unfortunately, a can of this rigidity has a slower thermal response time. The can retains sufficient heat content so that it imposes an appreciable delay in cooling rotors to desired centrifuging temperatures. This delay is both a result of the heat content of the can as well as the required temperature gradient to move heat across the can.

However, when lighter weight cans are used and initially installed, flexure of the bottom can wall occurs. Thus, the can itself at its bottom wall can no longer be utilized for ensuring firm contact between the thermoelectric coolers on one hand and the heat sink on the other hand.

Most critically, the efficiency of the thermoelectric cooler is dependent upon the heat discharge from the thermoelectric cooler. Such heat discharge includes heat extracted by the can as well as heat produced in the thermoelectric cooler by the Peltier effect. Ordinary heat sinks have been found other than optimum for this required heat discharge effect. As a result, cooling has been undesirably slow.

SUMMARY OF THE INVENTION

A thermoelectric cooling design of the type having a nonconducting substrate mounting thermoelectric coolers is improved. Provisions for a flexible can and improved heat dissipation from the thermoelectric coolers are provided. For improved thermal response, the refrigerated vacuum can is provided with thin walls of high purity aluminum with the result that deformation of the wall surface, especially the bottom wall surface can occur both with respect to installation. A plurality of can heat sinks are placed on the walls of the can to form a unitary and locally rigid side wall to the can at the point of attachment. At least one thermoelectric cooler is communicated to the can heat sinks at a first side for receiving heat energy from the can. A second discharge heat sink is communicated to each thermoelectric cooler for dissipating heat energy from both the can and the thermoelectric cooler. Spring biased connections move the respective heat sinks towards one another and clamp the thermoelectric cooler firmly therebetween. The heat sinks dynamically conform to dimensional changes at the cooler interface during installation. The discharge heat sinks are integrally cast with copper plugs placed in an aluminum mold and the aluminum cast about the copper plugs. The copper plug is preferably gold plated to prevent oxidation and form a heat conducting alloy with the aluminum. This enables heat transfer with a low temperature gradient to produce cooling with high efficiency.

OTHER OBJECTS, FEATURES AND ADVANTAGES

An object of this invention is to enable a can of reduced thickness having improved thermal response time to be utilized with a centrifuge. According to this aspect of the invention, a plurality of can heat sinks are secured to the flexible walls of the can preferably at the can undersides to form unitary and locally rigid heat transfer surfaces on the can. Thermoelectric coolers are communicated to the can. Second discharge heat sinks contact the thermoelectric coolers on the opposite side. By the expedient of clamping the respective heat sinks to and towards one another with spring biased connections, the thermoelectric coolers are maintained in firm heat conductive engagement to enable rapid cooling of the vacuum can.

An advantage of this design is that it permits ease of installation of the thermoelectric coolers in combination with a flexible can.

In accordance with another aspect of this invention an improved heat discharge sink is disclosed. Specifically, the heat sink mold is provided with a cleaned copper insert. Aluminum is thereafter poured into the mold. There results an integrally bound copper plug in an aluminum heat sink which enables heat transfer between copper and an aluminum alloy that can be cast to be improved by a factor of three (3).

It is noted that the ability to fabricate a heat sink from copper and aluminum is relatively unexpected. Specifically, a eutectic alloy of copper and aluminum can be expected to etch the copper insert during cooling of the aluminum. It has been found that the resultant alloy does not produce appreciable etching of the copper insert and further enables heat transfer. Gold plating or equipment non-oxidizing coatings may be used on copper to prevent oxidation of copper while hot.

A further object of this invention is to disclose is to disclose a preferred manner of casting a copper plug into an aluminum heat sink. According to this aspect of the invention, the copper plug is provided with a gold plating in the order of 10 to 100 millionths of an inch thickness. This gold plate produces non-oxidizing coating which diffuses into the aluminum producing an alloy forming a good metallurgical heat conducting bond.

There is provided a heat sink which has minimal thermal excursion over the discharged ambient temperature of the surrounding atmosphere. More efficient cooling is provided.

BRIEF DESCRIPTION OF THE DRAWINGS

Other objects, features, and advantages will become more apparent after referring to the following specification and attached drawings in which FIG. 1A is a side elevation schematic of a thermoelectrically cooled can illustrating the flexible can, attached can heat sink, thermoelectric cooler and discharge heat sink with the spring biased clamps therebetween;

FIG. 1B is an enlarged view of FIG. 1A in the vicinity of the clamp:

FIG. 2 is a plan view of the nonconductive strip and thermoelectric cooler adapting the principle of the Wedemeyer et al. U.S. Pat. No. 4,512,758 patent to the instant invention;

FIG. 3 is a plan view of a cooler illustrated in FIG. 1 showing attachment of the thermoelectric cooler: and FIG. 4 illustrates the casting of the copper aluminum discharge heat sinks for thermocommunication to the thermoelectric coolers.

Referring to FIG. 1 a can C is illustrated with a vacuum tight top T shown schematically in broken lines. A rotor R is placed within can C. Thereafter, a vacuum pump V (schematically shown) evacuates the interior of the can C. When a vacuum is reached, rotor R may be rotated so that contained samples (not shown) are centrifuged at high gravity fields.

Before centrifuging occurs with many samples, temperature must be precisely controlled. Thus, the attached apparatus at the bottom of can C. Assuming the proper temperature of the rotor (and necessarily of the sample) rotation of the rotor at speeds in the range of 100,000 revolutions per minute occurs. Gravity fields in the range of 250,000 to 500,000 times normal gravity are produced. Dependent upon the sedimentation constant of the constituents of the sample, classification of the sample in the intense gravity field occurs.

Classification of the sample in rotor R must occur at precisely controlled temperature. An example of such a temperature is 0° centigrade for certain biological samples. Before centrifuging, the sample must be brought to the precise temperature. During centrifuging, the sample must be maintained at the precise temperature. In either event cooling of the can C is required. Because of their small size and weight, thermoelectric devices using the Peltier effect are utilized.

Can C is typically produced from pure and nonalloyed aluminum. Compared to the can illustrated in Wedemeyer et al. U.S. Pat. 4,512,758, wall thickness of the can is reduced by 2/3. In the Wedemeyer reference the illustrated can had a wall thickness of 0.187-inches. Here, can C has a wall thickness of 0.065-inches.

Such a wall thickness has the advantage of improving thermal response times. Both the heat capacity of the can C and the thermal gradient produced by the can in cooling rotor R are reduced.

However, when the can C is provided with a reduced thickness, the circular bottom wall 18 of the can is subject to flexing. Such flexing can occur during assembly at wall 18.

Compounding this problem, thermoelectric coolers K require high thermal conductivity between can heat sinks 20 and discharge heat sinks 22. Specifically, and at the interface 24 between thermoelectric cooler K and discharge heat sink 22, a critical high flow heat discharge junction is defined.

Observing the interface 21 between can heat sink 20 and cooler K, the flow of heat will only be that heat extracted from the interior of can C and rotor R.

However, observing interface 24 between cooler K and discharge heat sink 22, the flow of heat will be all heat extracted from the can C and all heat produced by the Peltier effect interior of the thermoelectric cooler K.

By way of example, the heat flow across interface 21 (between the can communicated heat sink 20 and the thermoelectric cooler K) can be three (3) watts while the heat flow across interface 24 (between thermoelectric cooler K and discharge heat sink 24) can be thirty (30) watts or a magnitude greater. Because of this enlarged heat flow, heat exchange interface 24 is a critical interface in the disclosed cooler design for efficient cooling.

Having generally discussed the design problems, the specific of the disclosed structure will now be set forth.

Referring to FIGS. 1A and 1B at 30 and as illustrated in FIG. 2, a nonconductive substrate 30 as set forth in Wedemeyer et al. U.S. Pat. No. 4,512,758 is illustrated. The substrate here is in the form of a PC board which serves the dual purpose of clamping thermoelectric coolers K and providing wire attachment points 35.

The respective sides 37 of the thermoelectric cooler are provided with attachment grooves. These grooves are captured at edges 37 of board 30. There results a firm engagement of the coolers K to the board 30. In order to provide uniform clamping pressure across the thermoconducting devices K, secondary openings 44C and 44D are provided.

It is necessary to permit spring bias bolts to pass through nonconducting substrate 30. This is provided at apertures 38, 39 on either side of the thermoelectric cooler K.

Having set forth the details of the substrate, attention can now be devoted to the can C at its bottom wall 18 and the attachment of can heat sinks 20.

Specifically, can heat sinks 20 include parallel machined surfaces 19. These heat sinks 20, illustrated in FIG. 3 are circular and mate with bottom wall 18 of the can. The heat sinks are firmly attached at surface 19 to wall 18 of the can. Preferably such attachment occurs by clamping and gluing the heat sinks 20 with a thermally conductive glue, such that the disc surfaces all lie in a flat plane. The thickness of the glue may vary.

Each heat sink 20 thereafter forms with the respective can a rigid area in bottom wall 18. As the heat sink 20 moves, so does the bottom wall 18 move in the vicinity of the attached heat sink. The thickness of the heat sink 20 is selected so that upon clamping appreciable deformation of the heat sink 20 does not occur. Thus, when spring clamping forces are applied across the thermoelectric cooler K, pressure on the thermoelectric cooler is uniform.

As illustrated in FIG. 3, respective leads 40, 42 series connect the coolers K.

The reader will recall that the lower discharge heat sink 22 at interface 24 defines the critical parameter of this invention. This critical parameter can best be understood with respect to the mold and fabrication method illustrated in FIG. 4.

Referring to FIG. 4, a copper plug 50 is shown inserted in a mold 52. Mold 52 defines a female concavity in the shape and dimension of heat sink 22 and includes defined heat discharge fins 54. There is schematically illustrated a defined funnel 57 for receiving aluminum 60. Typically aluminum 60 is an alloy that can be cast so as to define an efficient thermal conductive body.

Copper plug 50 is inserted into the interior of the mold 52. It is positioned adjacent and with a surface 51 at interface 24 of the discharge heat sink 22. It is important that the copper insert 50 be cleaned. Otherwise, the introduced aluminum 60 will cause outgassing at the interface between the copper plug 50 and the introduced aluminum. Such out-gassing will constitute bubbles at the thermal conducting interface and cause inefficient heat transfer.

It is known that copper and aluminum form an alloy. This alloy is eutectic. In its formation it has been known to appreciably etch copper.

It was empirically found that the resultant alloy is extremely thin and does not appreciably interfere with the desired heat transfer. Specifically, an alloy interface 53 is ultimately produced (it being realized the interface 53 is enlarged for clarity).

It has been found preferred to plate the copper insert 50 with gold in the range of 10 to 100 millionths of an inch thickness. This plating, applied before casting, prevents oxidation and diffuses in the aluminum forming an alloy. This alloy forms an improved metallurgical heat conducting bond.

It will be appreciated that copper insert 50 could be precisely machined and thereafter inserted within heat sink 22. However, the casting technique herein illustrated greatly reduces precision machining and hence the cost of the produced alloy.

Having set forth the construction of the lower heat sink, the function of the paired spring clamps on each thermoelectric cooler K can now be set forth.

Specifically, and with reference to FIGS. 1A and 1B, lower heat sink 24 is drilled and tapped at 70. A bolt 71 at complementary threads 72 fits and threads interiorly of the tap 70.

A plastic insert 74 is placed interior of apertures 76 in upper heat sink 20 and 78 in lower heat sink 22. The insert is fastened to the side walls of apertures 80 in can C.

A coil spring 85 under compression is captured between the enlarged head of bolt 71 and the bottom of insert 74.

The action of the spring in procuring a clamp over the thermoelectric cooler K can be easily understood. Specifically, the spring under compression urges bolt 71 upwardly. In such urging, heat sink 22 is drawn firmly over the lower surface of thermoelectric cooler K at interface 24. The thermoelectric cooler K at interface 21 presses up in firm thermal conducting engagement with can heat sink 20. A thermal circuit of high conductivity is established. Efficient heat flow from the interior of the can C to the heat sink 22 is enabled.

Thus it can be seen that each of the heat sinks 20 in their immediate vicinity causes the bottom wall 18 of the can C to act as a rigid and unitary member. At the same time, the copper insert 50 in heat sink 22 provides an improved thermal conducting interface 24. Thus, the thermoelectric cooler at interface 24 can typically operate within 5° of ambient temperature exterior of the heat sink 22.

What is claimed is:

1. A thermoelectrically cooled can for a centrifuge comprising in combination:
    a thermal conductive can having flexible walls;
    at least one can heat sink for placement to the walls of said can, said can heat sink attached at a first side to said can to form a unitary and locally rigid structure with said can at the point of attachment and having a flat surface for contact with a thermoelectric cooler on a second side:
    at least one thermoelectric cooler having a first heat receiving side communicated to said second side of said can heat sink and having a heat discharge side for passing heat energy away from said can:
    a second discharge heat sink communicated to each said thermoelectric cooler at said heat discharge side for dissipating the heat energy from said can and the heat energy from said thermoelectric cooler: and.
    means for urging said second discharge heat sink over said thermoelectric cooler towards said can heat sink, said means comprising at least first and second spring bias connectors fastened at one end to said can heat sink and attached to said second discharge heat sink at the other end whereby said spring bias connectors trap said thermoelectric cooler in firm engagement with said can heat sink and said discharge heat sink to discharge heat energy.

2. The thermoelectrically cooled can for a centrifuge of claim 1 and wherein
    said second discharge heat sink communicated to each said thermoelectric cooler at said heat discharge side includes:
    a copper insert for direct attachment to said discharge side of said thermoelectric cooler: and,
    a cast aluminum body surrounding said copper insert for discharging heat to ambient.

3. The thermoelectrically cooled can for a centrifuge of claim 2 and wherein:
    said copper insert is gold plated.

* * * * *